(12) United States Patent
Kokubun et al.

(10) Patent No.: US 6,448,836 B2
(45) Date of Patent: Sep. 10, 2002

(54) OPERATIONAL AMPLIFIER AND ITS OFFSET CANCEL CIRCUIT

(75) Inventors: Masatoshi Kokubun; Shinya Udo; Seiji Yamagata; Chikara Tsuchiya, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/731,710

(22) Filed: Dec. 8, 2000

(30) Foreign Application Priority Data

Apr. 7, 2000 (JP) ........................................ 2000-105980

(51) Int. Cl.[7] .................................................. H03L 5/00
(52) U.S. Cl. ......................... 327/307; 327/91; 327/310
(58) Field of Search ................................ 327/307, 310, 327/91, 94, 95, 337; 330/253; 328/127

(56) References Cited

U.S. PATENT DOCUMENTS 4,365,204 A * 12/1982 Haque ....................... 328/127
4,884,039 A * 11/1989 King et al. ................. 330/253
6,169,440 B1 * 1/2001 Liu ............................ 327/337

FOREIGN PATENT DOCUMENTS

| JP | 5-129848 A | 5/1993 |
| JP | 11-330874 A | 11/1999 |

* cited by examiner

Primary Examiner—Kenneth B. Wells
Assistant Examiner—Hiep Nguyen
(74) Attorney, Agent, or Firm—Arent Fox Kintner Plotkin & Kahn, PLLC (57) ABSTRACT

An offset cancel circuit for an operational amplifier comprises a capacitive element for storing a voltage to be amplified by an operational amplifier section and containing an offset, and for feedback-controlling a voltage value of the operational amplifier section based on the stored voltage, and switching elements for switching operation between the storage of the voltage in the capacitive element and the feedback control based on the value of the voltage stored in the capacitive element. The capacitive element and the switching elements can be used to cancel accurately an offset in the operational amplifier section without increasing the gate areas of transistors in the operational amplifier section.

24 Claims, 11 Drawing Sheets

OPERATIONAL AMPLIFIER AND ITS OFFSET CANCEL CIRCUIT

BACKGROUND OF THE INVENTION

1. Field of the Invention

The present invention relates to an operational amplifier and its offset cancel circuit, in particular, suitable for use in a source driver IC for a liquid crystal display (LCD) having a plurality of operational amplifier outputs in the same chip.

2. Description of the Related Art

In a liquid crystal panel of a liquid crystal display (LCD), one pixel is composed of three colors of red, blue, and green. Each color has, for example, 64 gradations. In this case, 64×64×64≈260,000 colors can be displayed per pixel. An LCD source driver generates gradation voltages at 64 levels for each of the three colors. Each gradation voltage is generated as positive or negative type with respect to a common electrode.

Figure 1:
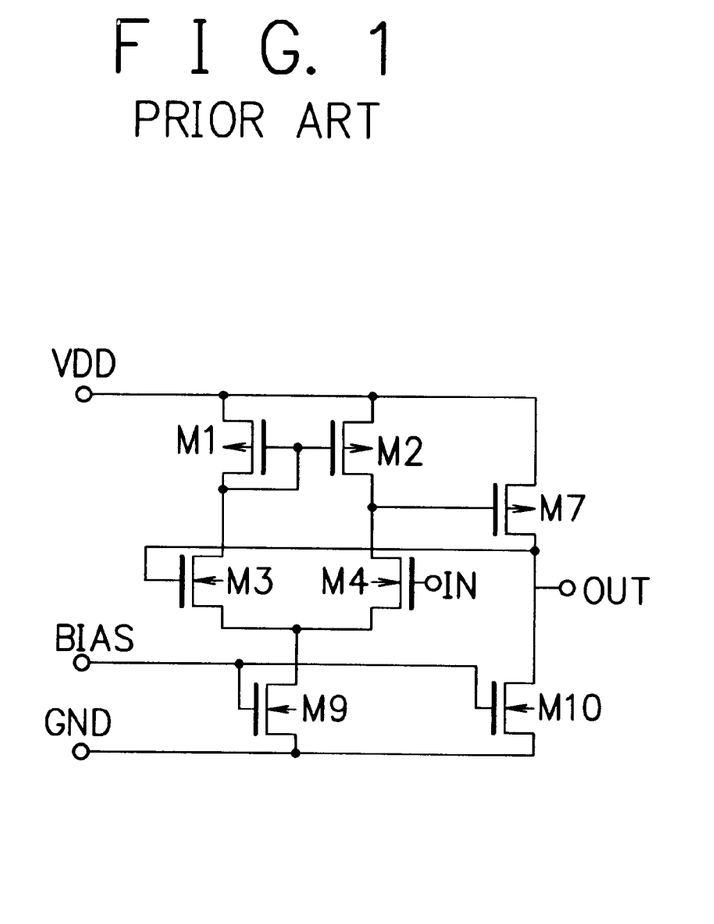
FIG. 1 is a circuit diagram showing the configuration of a conventional operational amplifier.

FIG. 1 is a circuit diagram showing the configuration of a conventional operational amplifier. The operational amplifier shown in FIG. 1 comprises a current mirror section comprising a pair of p-channel transistors M1 and M2; a differential input section connected to the current mirror section and comprising a pair of n-channel transistors M3 and M4; two n-channel transistors M9 and M10 which function as constant current circuits; and a p-channel transistor M7 for switching in the output stage.

The two p-channel transistors M1 and M2 constituting the current mirror section have their sources connected to a power supply VDD and their drains connected to the differential input section. The two n-channel transistors M3 and M4 constituting the differential input section have their gates connected to an output terminal OUT and an input terminal IN, respectively.

To the differential input section, connected is the n-channel transistor M9 which functions as a constant current circuit. This n-channel transistor M9 has its gate connected to a bias voltage source and its source connected to the ground GND. Also the n-channel transistor M10 which functions as another constant current circuit, has its gate connected to the bias voltage source and its source connected to the ground GND. The n-channel transistor M10 has its drain connected to the output terminal OUT together with the drain of the p-channel transistor M7 in the output stage.

The above described LDC source driver IC has a plurality of operational amplifiers arranged therein and each configured as shown in FIG. 1. The operational amplifiers, however, have offsets caused by manufacturing variation or the like, and the amount of offset varies from operational amplifier to operational amplifier. For this reason, neighboring operational amplifiers, which must originally output the same voltage value, may output different ones due to an offset in each operational amplifier. If this output deviation increases, irregularity in color on the display of the LCD may occur. The offsets in the individual operational amplifiers must be suppressed to prevent such irregularity in color.

To suppress offset in such an operational amplifier, the gate areas of transistors constituting the operational amplifier, in particular, the gate areas of the p-channel transistors M1 and M2 of the current mirror section and of the n-channel transistors M3 and M4 of the differential input section are conventionally increased to reduce the manufacturing variation relatively, thereby restraining the offset in the operational amplifier.

However, the amount of offset ($\Delta$Vgs) in the operational amplifier and the gate areas (S) of the transistors have the relationship $\Delta$Vgs 1/√S. For example, reducing the offset amount to half requires the gate areas of the transistors to be quadrupled. Thus, when such a conventional method is used to attempt to increase the definition of a recent LCD (a voltage range of several mV per gradation), the gate areas of the operational amplifier become very large, thereby increasing the chip area and cost.

SUMMARY OF THE INVENTION

It is an object of the present invention to suppress offset in an operational amplifier without increasing its gate areas.

An offset cancel circuit for an operational amplifier according to the present invention is characterized by comprising a capacitive element for storing a voltage to be amplified by an operational amplifier section and containing an offset and for feedback-controlling a voltage value of the operational amplifier section based on the stored voltage, and a switching element for switching operation between the storage operation for the voltage into the capacitive element and the feedback control operation based on the stored voltage value.

Since the present invention comprises the above technical means, when a voltage is input to an input terminal, each switching element is appropriately switched to store a voltage containing an offset, in the capacitive element. Each switching element is subsequently appropriately switched to provide such a feedback control that the gate voltages of the operational amplifier section become equal based on the voltage stored in the capacitive element, thereby canceling the offset in the operational amplifier section. Consequently, the offset in the operational amplifier section can be accurately canceled without increasing the gate areas of transistors in the operational amplifier section, thereby preventing chip area and cost from increasing. The present invention can therefore be applied to a source driver for a liquid crystal panel to prevent irregularity in color, thereby allowing the liquid crystal panel to be driven with a higher definition.

DETAILED DESCRIPTION OF THE PREFERRED EMBODIMENTS

Embodiments of the present invention will be described below with reference to drawings.
(First Embodiment)

Figure 2:
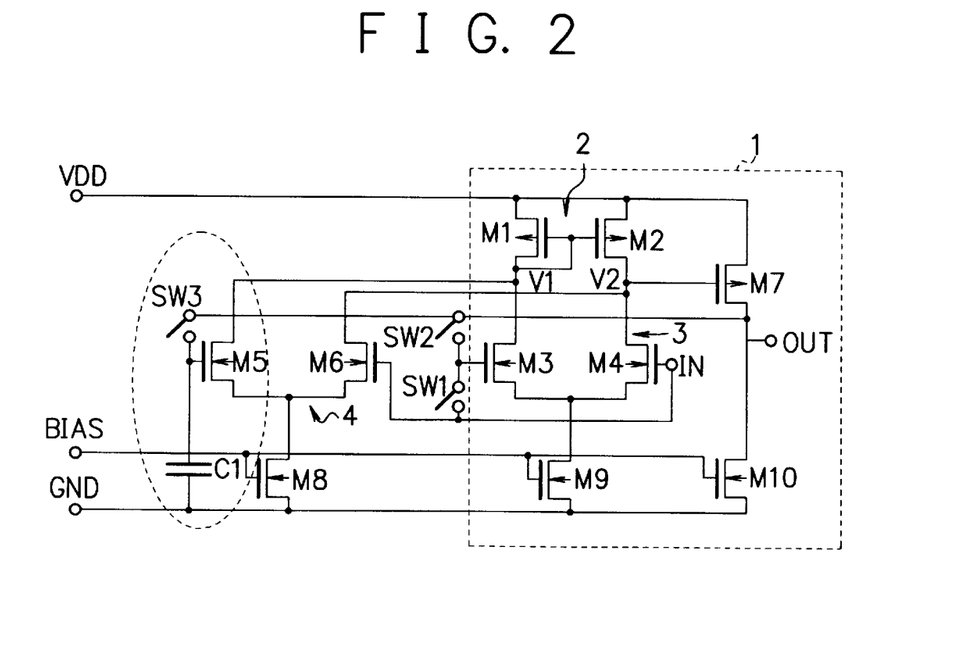
FIG. 2 is a circuit diagram showing the configuration of an operational amplifier and its offset cancel circuit according to the first embodiment of the present invention.

FIG. 2 is a circuit diagram showing the configuration of an operational amplifier and its offset cancel circuit according to the first embodiment of the present invention.

In FIG. 2, an operational amplifier section 1 has a configuration similar to that of the conventional operational amplifier shown in FIG. 1, which comprises a current mirror section 2 comprising a pair of p-channel transistors M1 and M2, a first differential input section 3 comprising a pair of n-channel transistors M3 and M4, and so on.

According to this embodiment, the operational amplifier section 1 further has a second differential input section 4 connected to the current mirror section 2 and comprising a pair of n-channel transistors M5 and M6, an n-channel transistor M8 connected to the second differential input section 4 to operate as a constant current circuit, and three switching elements SW1 to SW3.

The n-channel transistors M5 and M6 constituting the second differential input section 4, have their drains respectively connected to the drains of the p-channel transistors M1 and M2 constituting the current mirror section 2 in the operational amplifier section 1. The n-channel transistor M6 has its gate (a positive input gate of the second differential input section 4) connected to an input terminal IN, while the n-channel transistor M5 has its gate (a negative input gate of the second differential input section 4) connected to an output terminal OUT via the third switch SW3.

The n-channel transistor M8 connected to the source side of the second differential input section 4 has its gate connected to a bias voltage source and its source connected to the ground GND. A capacitor C1 is connected between the gate of the n-channel transistor M5 constituting the second differential input section 4, and the ground GND.

The first switch SW1 is connected between the gate (a negative input gate of the first differential input section 3) of the n-channel transistor M3 constituting the first differential input section 3 in the operational amplifier section 1, and the input terminal IN connected to the gate (a positive input gate of the first differential input section 3) of the n-channel transistor M4 constituting the differential input section 3. The second switch SW2 is connected between the gate of the n-channel transistor M3 constituting the first differential input section 3 in the operational amplifier section 1, and the output terminal OUT. The third switch SW3 is connected between the gate of the n-channel transistor M5 constituting the second differential input section 4, and the output terminal OUT.

Each of the first to third switches SW1 to SW3 is composed, for example, of a transfer gate comprising a combination of a p-channel MOS transistor and an n-channel MOS transistor. The transfer gate may be composed of only a p- or n-channel MOS transistor. Switching elements that will be explained in the following embodiments are configured in a similar manner.

Figure 3:
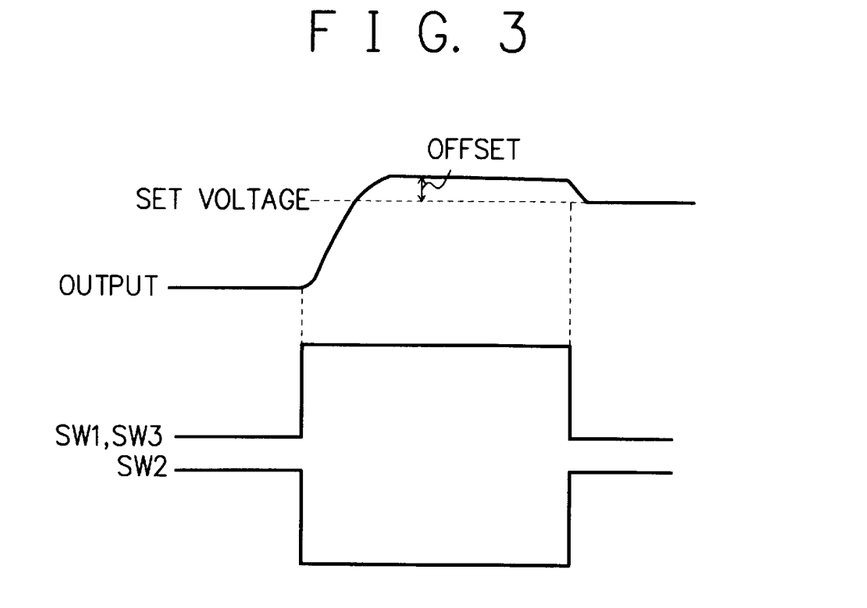
FIG. 3 is a timing chart for explaining the operation of the offset cancel circuit according to the first embodiment.

Next, the operation of the offset cancel circuit configured as described above will be described. FIG. 3 is a timing chart for explaining the operation of the offset cancel circuit according to this embodiment. As shown in FIG. 3, the first and third switches SW1 and SW3 operate in the same phase, whereas the second switch SW2 operates in the inverse phase.

When a voltage is input to the input terminal IN, the first and third switches SW1 and SW3 are turned on, while the second switch SW2 is turned off. The same voltage is thus applied to the two n-channel transistors M3 and M4 constituting the first differential input section 3. The voltage at the input terminal IN is applied to the gate of the n-channel transistor M6 constituting the second differential input section 4, and the voltage at the output terminal OUT is applied to the gate of the n-channel transistor M5.

Accordingly, the first differential input section 3 does not operate, whereas the second differential input section 4 operates as a differential amplifier. In this case, as shown in FIG. 3, the voltage at the output terminal OUT is increasingly amplified with time elapsing with following the voltage at the input terminal IN up to a voltage value including an offset. In the example of FIG. 3, the n-channel transistor M6 has a higher offset voltage than the n-channel transistor M5, and thus this operational amplifier has an offset voltage larger than a referential set value.

While the second differential input section 4 is operating thus, a capacitor C1 is charged with the voltage value including the offset. At this point of time, the drain voltages V1 and V2 of the p-channel transistors M1 and M2 constituting the current mirror section 2, are ideally equal to each other (V1=V2), but the circuit stabilizes in the state of V1≠V2 because the ratios of the offset voltages at the transistors M1, M2, M3, and M4 (M1:M2, M3:M4) vary due to manufacturing variation or the like in the operational amplifier. The different values of the voltages V1 and V2 and the voltage values of the input and output terminals IN and OUT determine currents flowing through the n-channel transistors M5 and M6. The period up to this time is called "charge period".

Next, after the circuit has stabilized to end the charge period, the first and third switches SW1 and SW3 are turned off and the second switch SW2 is turned on. The first differential input section 3 then operates as a differential amplifier, and the n-channel transistors M5 and M6 of the second differential input section 4 operate as constant current circuits.

At this point of time, the third switch SW3 remains off, so that the voltage stored in the capacitor C1 is not discharged but held therein. Accordingly, since the gate voltage of the n-channel transistor M5 is held by the voltage stored in the capacitor C1, the constant current circuits comprising the n-channel transistors M5 and M6 provide such a feedback control that the gate voltages of the n-channel transistors M3 and M4 are equal to each other, thereby canceling the offset to settle the voltage at a set value as shown in FIG. 3. This period is hereafter called "cancel period".

When the cancel period has ended to turn the first and third switches SW1 and SW3 on and turn the second switch SW2 off, a voltage is stored again in the capacitor C1 depending on the voltage values of the input and output terminals IN and OUT at that time. At this point of time, if the voltage to be stored is higher than the previously stored voltage, the capacitor C1 is charged; if the voltage to be stored is lower than the previously stored voltage, the capacitor C1 is discharged.

As described above, in the first embodiment, the operational amplifier section 1 additionally has the second differential input section 4, the capacitor C1, and the switches SW1 to SW3. During the charge period, the second differential input section 4 is operated to store the value of a voltage containing an offset, in the capacitor C1. Once the circuit has stabilized, the cancel period is started to operate the first differential input section 3 in the operational amplifier section 1. Then, during the charge period, the voltage stored in the capacitor C1 is used to provide such a feedback control that the offset in the operational amplifier is canceled.

The offset in the operational amplifier can thus be canceled without increasing the gate areas of the transistors, thereby obtaining an accurate output voltage value. That is, according to this embodiment, the offset can be reduced to about one-fifths to one-tenths with the gate area unchanged.

Figure 4A:
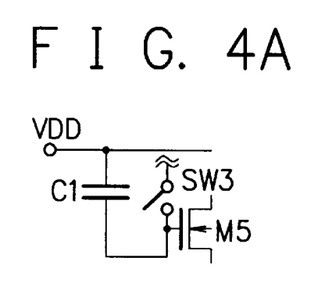
FIGS. 4A and 4B are circuit diagrams showing other examples of connections in the shaded portion in FIG. 2.
Figure 4B:
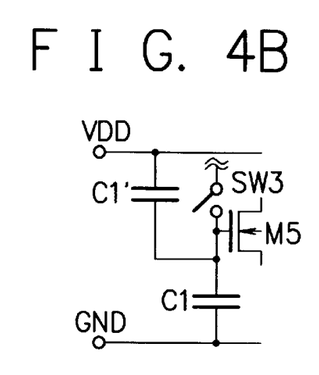

FIGS. 4A and 4B are circuit diagrams showing other example of connection of the n-channel transistor M5, the capacitor C1, and the third switch SW3 in the shaded portion in FIG. 2.

In FIG. 2, the capacitor C1 is connected between the gate of the n-channel transistor M5 and the ground GND. In contrast, the capacitor C1 may be connected between the gate of the n-channel transistor M5 and the power supply VDD as shown in FIG. 4A.

If noise occurs in the ground GND during the above-described charge period, the value of a voltage containing this ground noise is stored in the capacitor C1. In this case, the value of the voltage stored in the capacitor C1 is inaccurate, so that the offset in the operational amplifier cannot be accurately canceled even by providing feedback control with the voltage stored in the capacitor C1 during the cancel period. However, by connecting the capacitor C1 to the power supply VDD as shown in FIG. 4A, the offset in the operational amplifier can be accurately canceled without being affected by the ground noise.

As shown in FIG. 4B, the capacitor C1 and a capacitor C1' may be connected between the gate of the n-channel transistor M5 and the ground GND and between the gate of the n-channel transistor M5 and the power supply VDD, respectively. With this configuration, even if noise occurs either in the ground GND or in the power supply VDD during the charge period, the adverse effect of the noise can be suppressed to cancel the offset in the operational amplifier accurately.

(Second Embodiment)

Next, the second embodiment of the present invention will be described.

Figure 5:
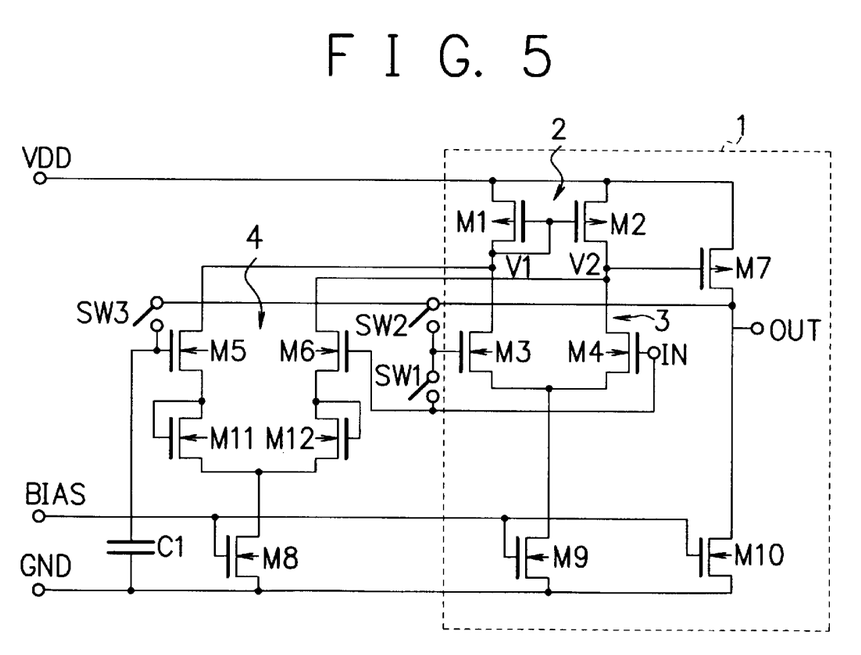
FIG. 5 is a circuit diagram showing the configuration of an operational amplifier and its offset cancel circuit according to the second embodiment of the present invention.

FIG. 5 is a circuit diagram showing the configuration of an operational amplifier and its offset cancel circuit according to the second embodiment. In this figure, components having the same reference numerals as those in FIG. 2 provide the same functions, and detailed description thereof is thus omitted.

According to the second embodiment shown in FIG. 5, the circuit shown in FIG. 2 further comprises n-channel transistors M11 and M12 having their drains and gates connected to the same nodes. The n-channel transistor M11 has its drain and gate connected to the source of the n-channel transistor M5, and the n-channel transistor M12 has its drain and gate connected to the source of the n-channel transistor M6. The n-channel transistors M11 and M12 have their sources connected to the drain of the n-channel transistor M8.

The operational principle of cancellation of offset is similar to that in the above-described first embodiment. The n-channel transistors M11 and M12 newly added according to this embodiment, are for preventing countercurrents from flowing through the n-channel transistors M5 and M6 due to a dot inversion operation unique to such an LCD source driver, thereby raising the operational speed of the operational amplifier.

First, the dot inversion operation unique to the LCD source driver will be explained. In a liquid crystal panel of a liquid crystal display, gradation voltages that are positive and negative with respect to a common electrode are written in relation to each neighboring dots and each neighboring lines, in order to elongate the lifetime of the liquid crystal.

Figure 6:
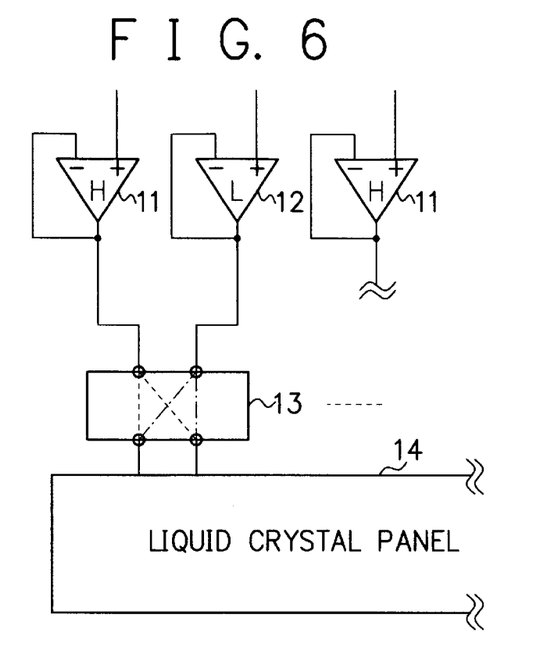
FIG. 6 is a circuit diagram showing an example of part of the configuration of an LCD source driver.

To enable this dot inversion operation, the LCD source driver has positive operational amplifiers (H-side operational amplifiers) 11 and negative operational amplifiers (L-side operational amplifiers) 12 alternately arranged therein as shown in FIG. 6. Each H-side operational amplifier 11 amplifies a positive analog gradation voltage for output. Each L-side operational amplifier 12 amplifies a negative analog gradation voltage for output.

The output stage comprising the plurality of H-side operational amplifiers 11 and L-side operational amplifiers 12 comprises 192 output switching sections 13. Each output switching section 13 switches the positive analog gradation voltage output from the H-side operational amplifier 11 and the negative analog gradation voltage output from the L-side operational amplifier 12 between a straight output and a cross output to the liquid crystal panel 14.

With the switching operation by the output switching section 13, when the output of one line of gradation voltages of a certain polarity has been completed and proceeds to the output of the next line of gradation voltages, a gradation voltage value of the opposite polarity is connected to the output of the operational amplifier. At this point of time, the drain voltage V2 of the p-channel transistor M2 drops instantaneously, and the voltage relationship in the embodiment in FIG. 2 will be such that the current flows through the transistors in the order of M1, M5, M6, and M4. If the current flows in the opposite direction in this manner, a long time is required to recover the normal operation mode.

Thus, in this embodiment, the n-channel transistors M5 and M6 are provided on their drain sides with the n-channel transistors M11 and M12, respectively. This configuration precludes countercurrents from flowing through the n-channel transistors M5 and M6 even when the output switching section 13 switches the output of the voltage value to a cross direction, thereby preventing the operational speed of the circuit from decreasing.

(Third Embodiment)

Next, the third embodiment of the present invention will be explained.

Figure 7:
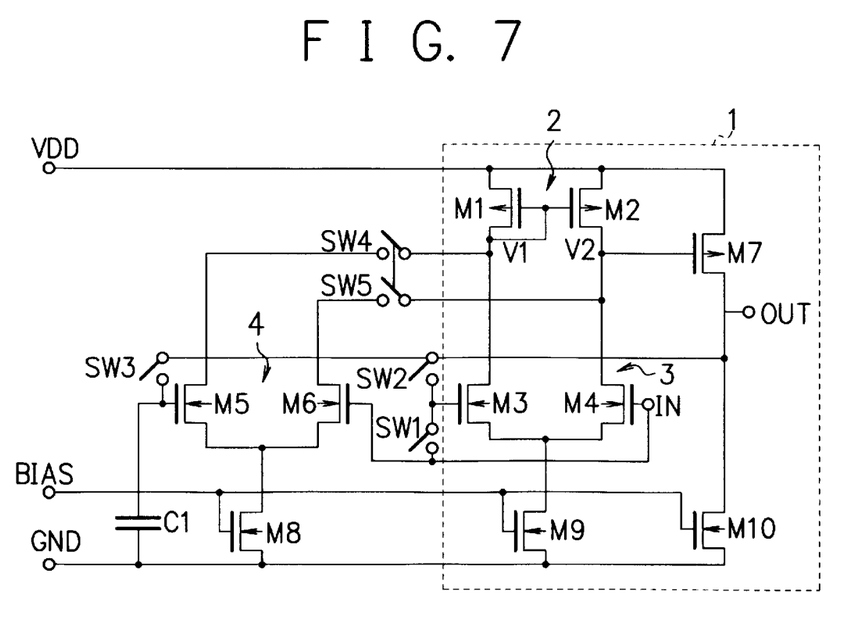
FIG. 7 is a circuit diagram showing the configuration of an operational amplifier and its offset cancel circuit according to the third embodiment of the present invention.

FIG. 7 is a circuit diagram showing the configuration of an operational amplifier and its offset cancel circuit according to the third embodiment. In this figure, components having the same reference numerals as those in FIG. 2 provide the same functions, and detailed description thereof is thus omitted.

According to the third embodiment shown in FIG. 7, the circuit shown in FIG. 2 further comprises fourth and fifth switches SW4 and SW5 between the drain of the first differential input section 3 and the drain of the second differential input section 4. That is, the fourth switch SW4 is connected between the drain of the n-channel transistor M3 and the drain of the n-channel transistor M5, while the fifth switch SW5 is connected between the drain of the n-channel transistor M4 and the drain of the n-channel transistor M6. The fourth and fifth switches SW4 and SW5 operate in the same phase.

The operational principle of cancellation of offset is similar to that in the above described first embodiment. Like the n-channel transistors M11 and M12 described in the second embodiment, the switches SW4 and SW5 newly added according to this embodiment, prevent a countercurrent from flowing through the second differential input section 4 during the dot inversion operation unique to the LCD source driver, thereby raising the operational speed of the operational amplifier.

Figure 8:
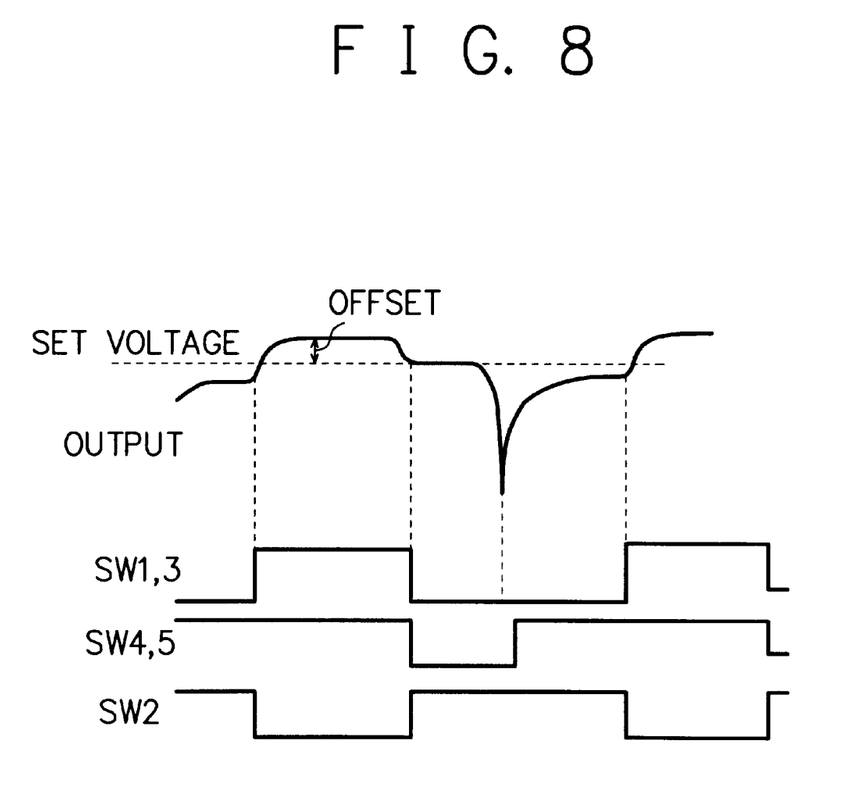
FIG. 8 is a timing chart for explaining the operation of the offset cancel circuit according to the third embodiment.

FIG. 8 is a timing chart for explaining the operation of the offset cancel circuit according to this embodiment. According to this embodiment, the switches SW1 to SW5 use the following switching timings. First, with the switches SW1, SW3, SW4 and SW5 being ON, and the switch SW2 being OFF, operation in the charge period is effected until the circuit is stabilized. Then, the switches SW1, SW3, SW4, and SW5 are turned off and the switch SW2 is turned on to proceed to the cancel period.

The switches SW4 and SW5 remain off until the output voltage value somewhat approaches a set value, and after the output switching section 13 has switched the output of the voltage value to the cross direction, the switches SW4 and SW5 are turned on again. When the output switching section 13 switches the output of the voltage value to the cross direction, the output voltage value decreases instantaneously, as shown in FIG. 8, but no countercurrent flows through the second differential input section 4 because the switches SW4 and SW5 are off at this time.

After the switches SW4 and SW5 have been turned on, the first differential input section 3 amplifies the output voltage value. Subsequently, when the switches SW1, SW3, SW4, and SW5 are turned on and the switch SW2 is turned off again, the second differential input section 4 amplifies the voltage up to a value containing an offset, with this voltage being stored in the capacitor C1. Similar operations are subsequently repeated.

As described above, according to the third embodiment, any countercurrent is prevented from flowing through the second differential input section 4 when the output switching section 13 switches the output of the voltage value to the cross direction, thereby precluding the operational speed of the circuit from decreasing, as in the above described second embodiment.

(Fourth Embodiment)

Next, the fourth embodiment of the present invention will be explained.

Figure 9:
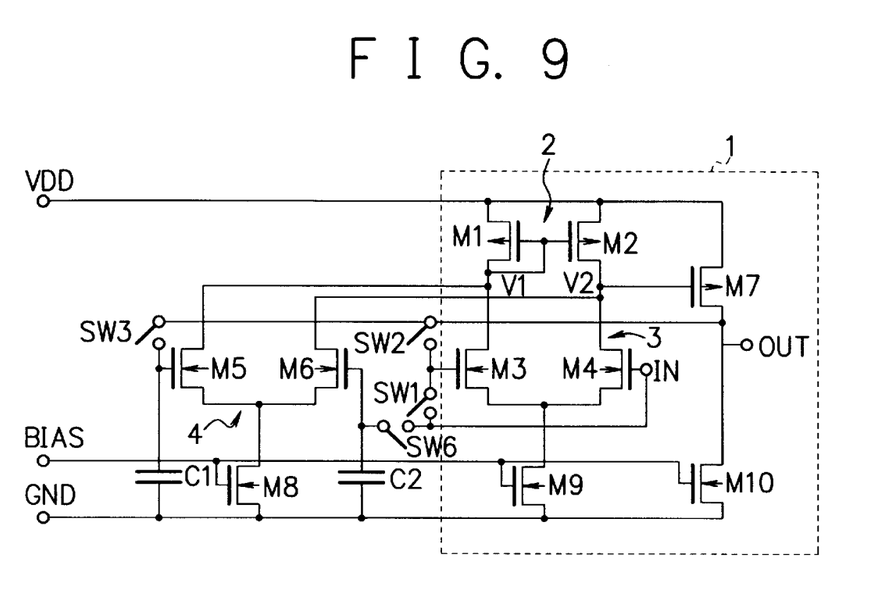
FIG. 9 is a circuit diagram showing the configuration of an operational amplifier and its offset cancel circuit according to the fourth embodiment of the present invention.

FIG. 9 is a circuit diagram showing the configuration of an operational amplifier and its offset cancel circuit according to the fourth embodiment. In this figure, components having the same reference numerals as those in FIG. 2 provide the same functions, and detailed description thereof is thus omitted.

According to the fourth embodiment shown in FIG. 9, the circuit shown in FIG. 2 further comprises a second capacitor C2 and a sixth switch SW6. The second capacitor C2 is connected between the gate of the n-channel transistor M6 constituting the second differential input section 4, and the ground GND. The sixth switch SW6 is connected between the gate of the n-channel transistor M6 and the input terminal IN.

The operational principle of cancellation of the offset is similar to that in the above described first embodiment, but in this case, the sixth switch SW6 is turned on and off similarly to the third switch SW3. Consequently, during the charge period when the switches SW1, SW3, and SW6 are turned on and the switch SW2 is turned off, the same voltage value containing the offset of the output voltage is stored in both the capacitors C1 and C2.

During the subsequent cancel period, the gate voltages of the n-channel transistors M5 and M6 are maintained at the value of the voltages stored in the two capacitors C1 and C2, respectively, so that the constant current circuits comprising the n-channel transistors M5 and M6 provide such a feedback control that the gate voltages of the n-channel transistors M3 and M4 are equal to each other, thereby canceling the offset in the operational amplifier to settle the voltage at the set value.

According to the fourth embodiment, even if ground noise or the like occurs in the ground GND, the gate voltages of the n-channel transistors M5 and M6 operate similarly based on the voltages held in the capacitors C1 and C2, respectively. This embodiment is therefore hard to undergo the adverse effect of noise, thereby enabling the offset to be canceled more accurately.

(Fifth Embodiment)

Next, the fifth embodiment of the present invention will be explained.

Figure 10:
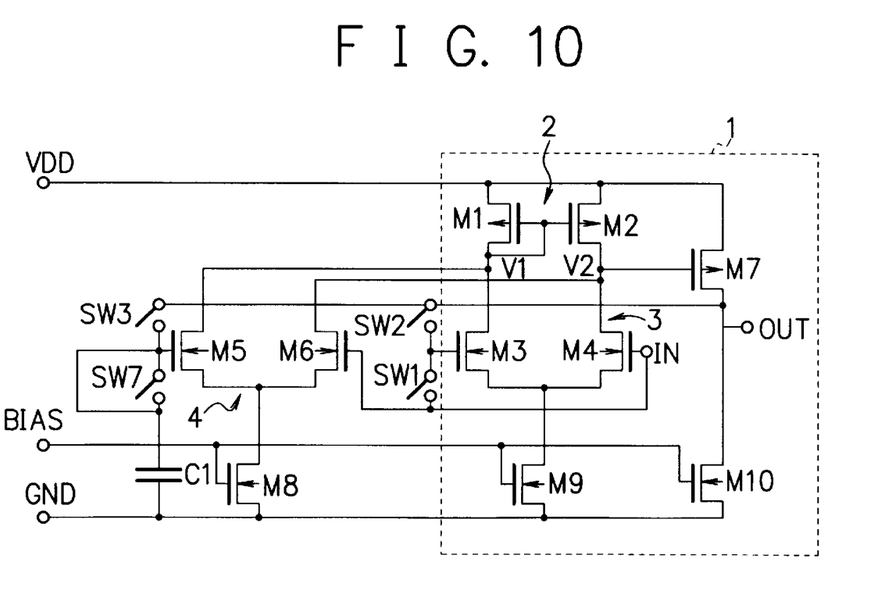
FIG. 10 is a circuit diagram showing the configuration of an operational amplifier and its offset cancel circuit according to the fifth embodiment of the present invention.

FIG. 10 is a circuit diagram showing the configuration of an operational amplifier and its offset cancel circuit according to the fifth embodiment. In this figure, components having the same reference numerals as those in FIG. 2 provide the same functions, and detailed description thereof is thus omitted.

According to the fifth embodiment shown in FIG. 10, the circuit shown in FIG. 2 further comprises a seventh switch SW7 as dummy. The seventh switch SW7 is connected between the gate of the n-channel transistor M5 constituting the second differential input section 4, and the capacitor C1, with both ends of the seventh switch SW7 being connected to the same node. The operational principle of cancellation of offset is similar to that in the above described first embodiment, but the seventh switch SW7 newly added according to this embodiment, operates based on a signal in the inverse phase to that of the third switch SW3.

Accordingly, since noise arising from switching by the third switch SW3 is canceled by the seventh switch SW7 operating based on the signal in the inverse phase, the disadvantage that the value of a voltage containing this switching noise is stored in the capacitor C1 can be prevented. As a result, the voltage value corresponding to the offset in the operational amplifier can be accurately stored in the capacitor C1, thereby enabling the offset to be canceled more accurately.

(Sixth Embodiment)

Next, the sixth embodiment of the present invention will be explained.

Figure 11:
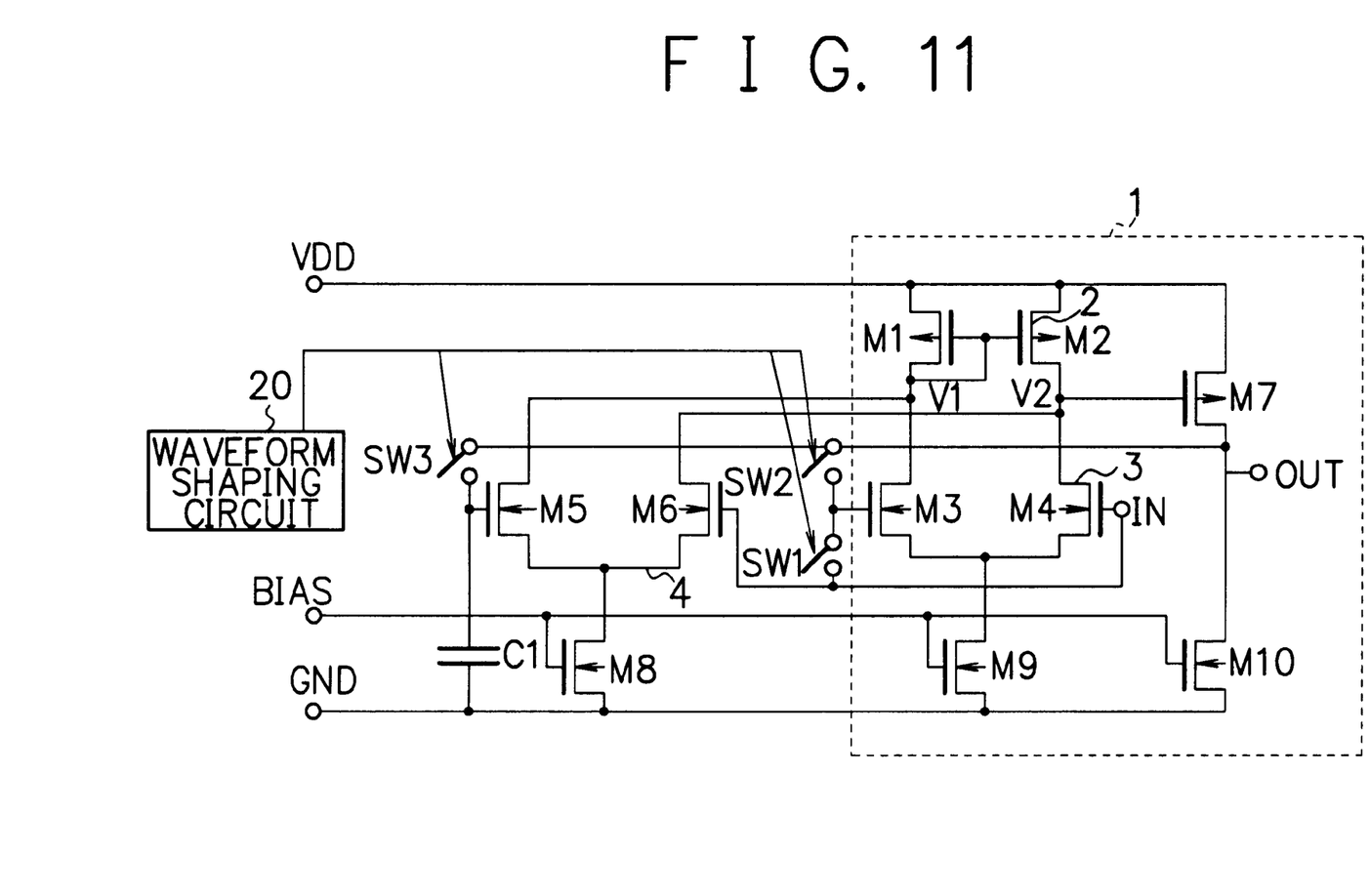
FIG. 11 is a circuit diagram showing the configuration of an operational amplifier and its offset cancel circuit according to the sixth embodiment of the present invention.

FIG. 11 is a circuit diagram showing the configuration of an operational amplifier and its offset cancel circuit according to the sixth embodiment. In this figure, components having the same reference numerals as those in FIG. 2 provide the same functions, and detailed description thereof is thus omitted.

According to the sixth embodiment shown in FIG. 11, the circuit shown in FIG. 2 further comprises a waveform shaping circuit 20 for shaping the waveform of a control signal for controlling turning-on and -off of the first to third switches SW1 to SW3. Turning-on and -off of the first to third switches SW1 to SW3 is controlled based on the waveform-shaped control signal output from the waveform shaping circuit 20.

Figure 12:
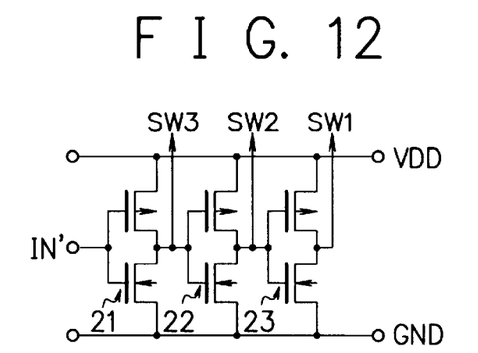
FIG. 12 is a circuit diagram showing an example of configuration of a waveform shaping circuit.

FIG. 12 is a circuit diagram showing an example of configuration of the waveform shaping circuit 20. As shown in this figure, the waveform shaping circuit 20 according to this embodiment is constructed by connecting, in multistage, inverters 21, 22, and 23 each of which comprises an n-channel transistor and a p-channel transistor. A switching control signal input from an input terminal IN' is then made to pass through the inverters 21, 22, and 23 to shape a dully rising or falling waveform into a sharply rising or falling waveform.

At this point of time, turning-on and -off of the third switch SW3 is controlled based on a control signal output from the first inverter 21, turning-on and -off of the second switch SW2 is controlled based on a control signal output from the second inverter 22, and turning-on and -off of the first switch SW1 is controlled based on a control signal output from the third inverter 23. Since the control signals for the switches SW1 to SW3 are respectively output from the different inverters 21 to 23, switching timings for the switches SW1 to SW3 are shifted in such a manner that the third switch SW3 is first turned on or off in this case.

As described above, in this embodiment, the waveform shaping circuit 20 provided for each operational amplifier shapes the waveform of the switching control signal so that the control signal rises or falls sharply and the switching operation is accelerated. Consequently, the disadvantage that switching may cause noise can be eliminated to enable the offset to be more accurately cancelled. In addition, in this embodiment, the switching timings for the switches SW1 to SW3 are shifted so that the switch SW3 is first turned off when changing from the charge period to the cancel period, thereby further diminishing the adverse effect of the switching noise.

Figure 13:
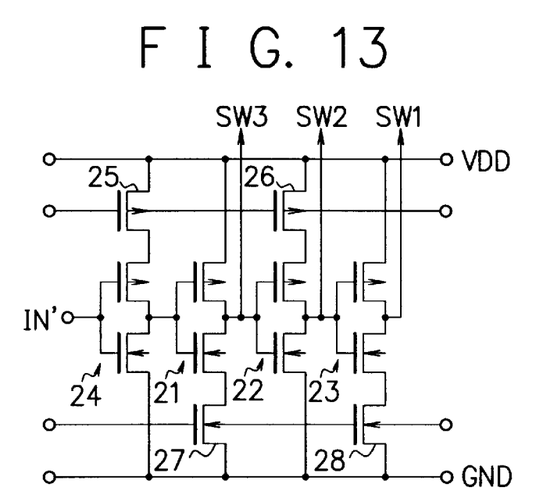
FIG. 13 is a circuit diagram showing another example of configuration of the waveform shaping circuit.

The configuration of the waveform shaping circuit 20 shown in FIG. 11 is not limited to that shown in FIG. 12. FIG. 13 is a circuit diagram showing another example of configuration of the waveform shaping circuit 20. The waveform shaping circuit 20 shown in FIG. 13 is provided with, in addition to inverters 21, 22, 23, and 24 connected in multistage, p-channel transistors 25 and 26 and n-channel transistors 27 and 28 used as switching elements.

The p-channel transistor 25 is connected between the first inverter 24 and the power supply VDD, and the p-channel transistor 26 is connected between the third inverter 22 and the power supply VDD. The n-channel transistor 27 is connected between the second inverter 21 and the ground GND, and the n-channel transistor 28 is connected between the fourth inverter 23 and the ground GND. That is, the waveform shaping circuit 20 in FIG. 13 is composed of the plurality of inverters connected in multistage and each having the p- or n-channel transistor alternately vertically stacked thereon.

Switching of each of the p-channel transistors 25 and 26 is controlled based on a control signal at "H" or "L" level commonly given to their gates. Also, switching of each of the n-channel transistors 27 and 28 is controlled based on a control signal at "H" or "L" level commonly given to their gates.

The p-channel transistors 25 and 26 and the n-channel transistors 27 and 28 are normally on, but are turned off temporarily when changing from the charge period to the cancel period, to restrain the flow of a through current induced by the switching control signal, thereby hindering power noise or the like originating in the through current. Consequently, the occurrence of power noise is reduced to enable the offset to be accurately cancelled.

Figure 14:
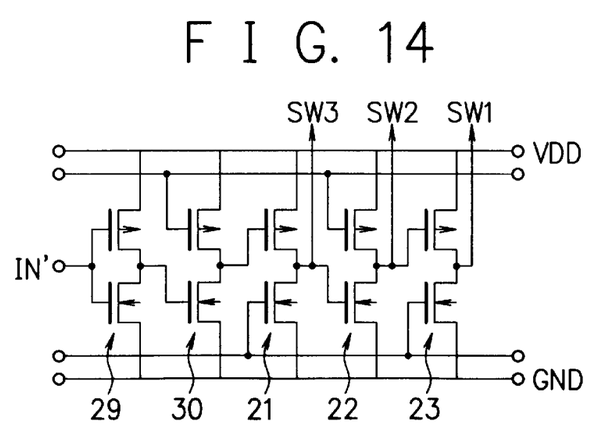
FIG. 14 is a circuit diagram showing still another example of configuration of the waveform shaping circuit.

FIG. 14 is a circuit diagram showing still another example of configuration of the waveform shaping circuit 20. The waveform shaping circuit 20 shown in FIG. 14 has inverters 21, 22, 23, 29, and 30 connected in a manner different from those in the above examples. That is, a signal output from the common drain of the first inverter 29 is input to the gate of an n-channel transistor of the second inverter 30, and a control signal at "H" or "L" level is input to the gate of a p-channel transistor of the second inverter 30.

A signal output from the common drain of the second inverter 30 is input to the gate of a p-channel transistor of the third inverter 21, and a control signal at "H" or "L" level is input to the gate of an n-channel transistor of the third inverter 21. For the inverters subsequent to the third inverter 21, their outputs are alternately connected to the p- or n-channel gate of the subsequent inverter. This connection restrains the flow of the through current induced by the switching control signal to reduce the occurrence of power noise, thereby enabling the offset to be accurately cancelled.

(Seventh Embodiment)

Next, the seventh embodiment of the present invention will be explained.

Figure 15:
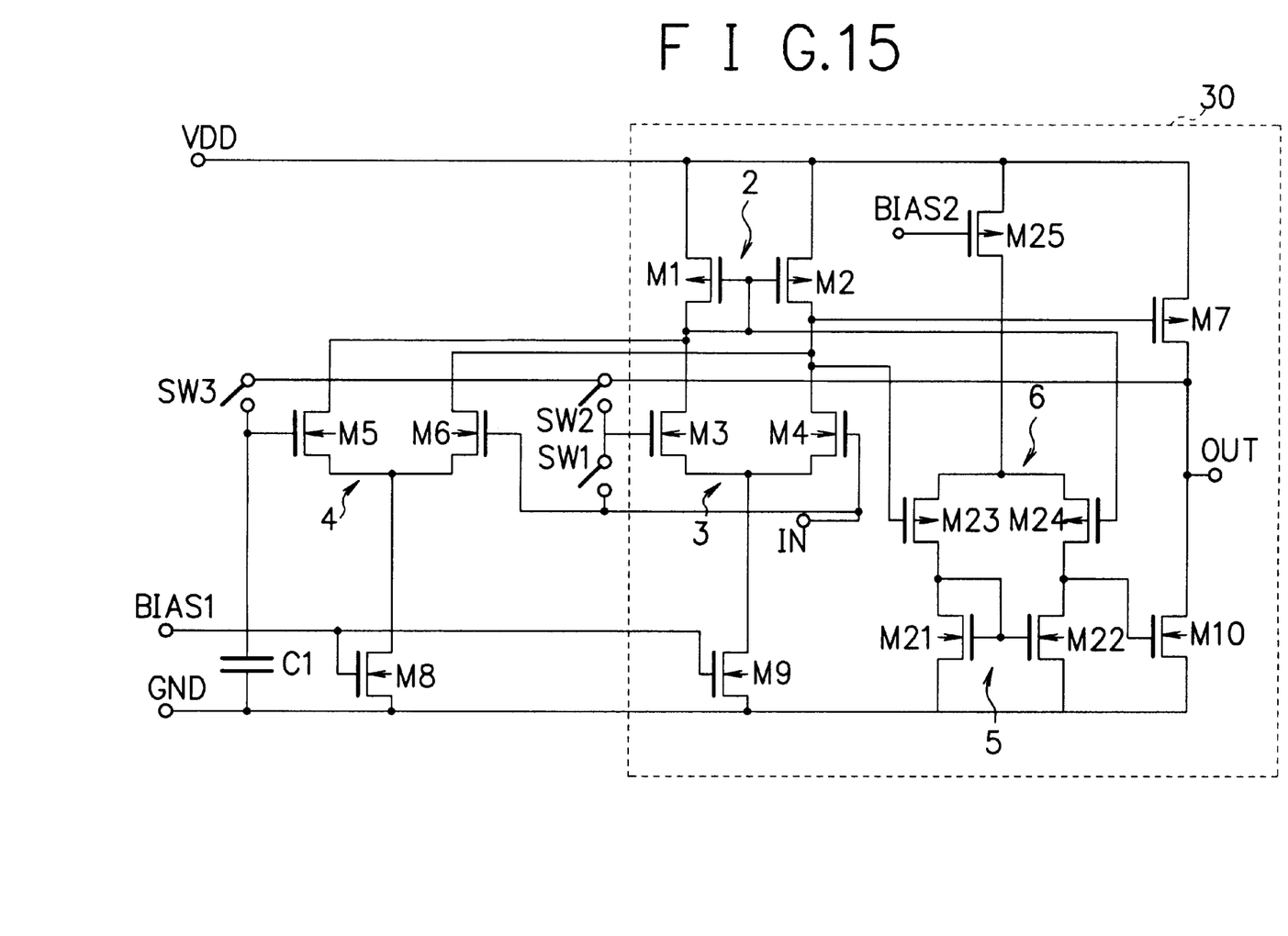
FIG. 15 is a circuit diagram showing the configuration of an operational amplifier and its offset cancel circuit according to the seventh embodiment of the present invention.

FIG. 15 is a circuit diagram showing the configuration of an operational amplifier and its offset cancel circuit according to the seventh embodiment. In this figure, components having the same reference numerals as those in FIG. 2 provide the same functions, and detailed description thereof is thus omitted.

The previously described first to sixth embodiments show examples in which the operational amplifier section 1 has a constant-current type configuration, but the present invention is applicable to other types of operational amplifiers. An operational amplifier section 30 shown in FIG. 15 comprises a second current mirror section 5 comprising a pair of n-channel transistors M21 and M22 connected to the ground GND, a third differential input section 6 connected to the second current mirror section 5 and comprising a pair of p-channel transistors M23 and M24, and a p-channel transistor M25 connected between the third differential input section 6 and the power supply VDD.

The second current mirror section 5 and the third differential input section 6 are reverse in types of p and n to the first current mirror section 2 and the first differential input section 3. The third differential input section 6 has two input gates (gates of the p-channel transistors M23 and M24) connected to the connection nodes between the first current mirror section 2 and the first differential input section 3.

That is, the two p-channel transistors M23 and M24 constituting the third differential input section 6, have their gates respectively connecting to the drains (drains of the p-channel transistors M2 and M1 constituting the first current mirror section 2) of the n-channel transistors M4 and M3 constituting the first differential input section 3. The p-channel transistor M22 constituting the second current mirror section 5, has its drains connected to the gate of the n-channel transistor M10.

The operational amplifier section 30 thus configured is characterized by a high speed at which its amplifying operation stabilizes. Thus, by providing the operational amplifier section 30 with an offset cancel circuit comprising the second differential input section 4, the capacitor C1, the switches SW1 to SW3, and so on, an operational amplifier can be provided which stabilizes the amplifying operation at a high speed and which accurately cancels the offset.

(Eighth Embodiment)

Next, the eighth embodiment of the present invention will be explained.

Figure 16:
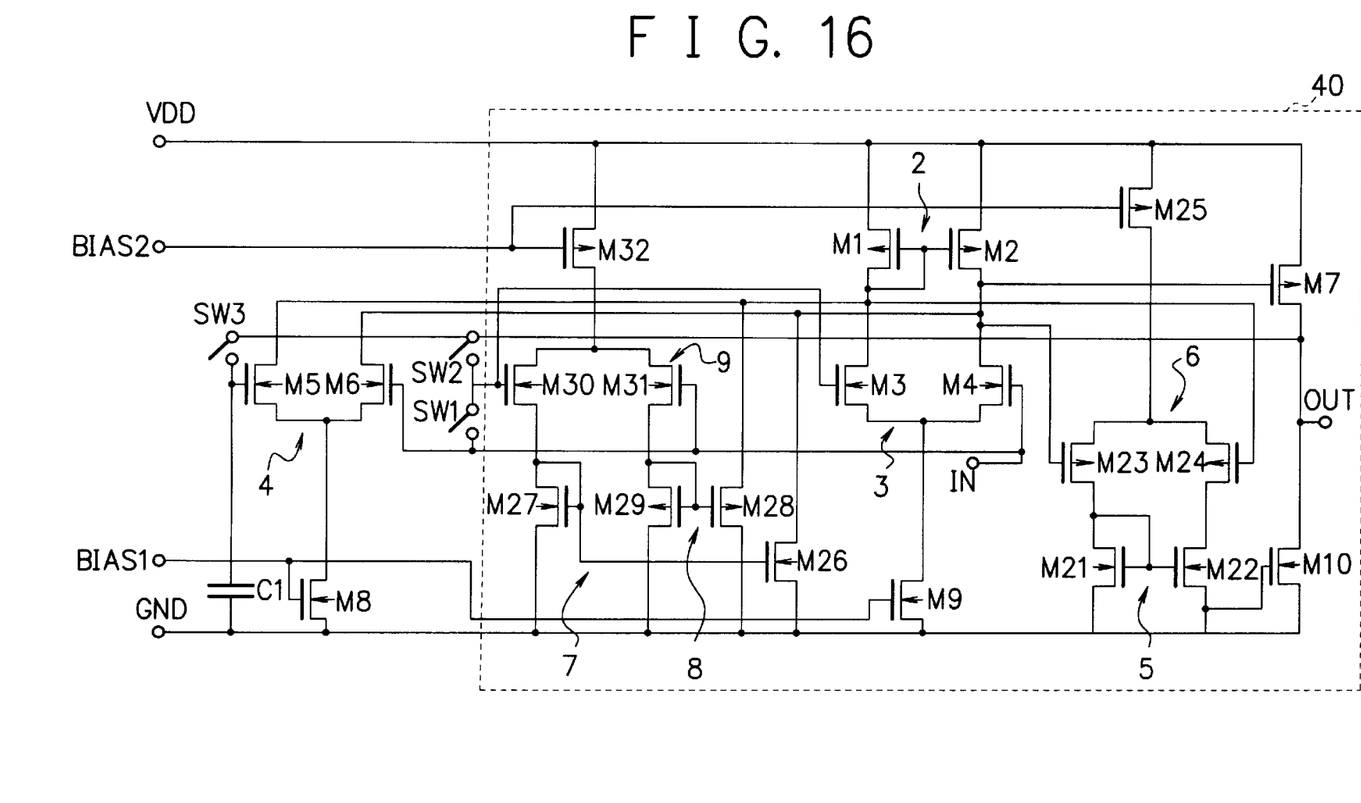
FIG. 16 is a circuit diagram showing the configuration of an operational amplifier and its offset cancel circuit according to the eighth embodiment of the present invention.

FIG. 16 is a circuit diagram showing the configuration of an operational amplifier and its offset cancel circuit according to the eighth embodiment. In this figure, components having the same reference numerals as those in FIG. 15 provide the same functions, and detailed description thereof is thus omitted.

Like the operational amplifier section 30 shown in FIG. 15, an operational amplifier section 40 shown in FIG. 16 comprises a second current mirror section 5, a third differential input section 6, and a p-channel transistor M25, and can stabilize the amplifying operation at a high speed. The operational amplifier section 40 according to this embodiment further comprises a polarity inverting circuit for inverting the polarity of a gradation voltage between positivity and negativity.

The polarity inverting circuit comprises two pairs of current mirror sections 7 and 8 respectively connected to the connection nodes between the first current mirror section 2 and the first differential input section 3, a fourth differential input section 9 connected to the two pairs of current mirror sections 7 and 8, and a p-channel transistor M22 connected between the fourth differential input section 9 and the power supply VDD.

The current mirror section 7 is composed of an n-channel transistor M26 connected between the drain of the p-channel transistor M2 constituting the first current mirror section 2, and the ground GND, and an n-channel transistor M27 connected between the source of the n-channel transistor M20 constituting the fourth differential input section 9, and the ground GND. The n-channel transistor M27 has its drain and gate connected to a common node.

The current mirror section 8 is composed of a p-channel transistor M28 connected between the drain of the p-channel transistor M1 constituting the first current mirror section 2, and the ground GND, and a p-channel transistor M29 connected between the source of the n-channel transistor M21 constituting the fourth differential input section 9, and the ground GND. The p-channel transistor M29 has its drain and gate connected to a common node.

The operational amplifier section 40 according to the eighth embodiment can output gradation voltages at from the ground GND level to the power supply VDD level while arbitrarily changing its polarity. The operational amplifier section 40 makes it possible to eliminate the need to divide the operational amplifier into the H-side operational amplifier 11 and the L-side operational amplifier 12 as shown in FIG. 6.

Thus, by providing the operational amplifier section 40 with an offset cancel circuit comprising the second differential input section 4, the capacitor C1, the switches SW1 to SW3, and so on, an operational amplifier can be provided which stabilizes the amplifying operation at a high speed and which accurately cancels the offset.

(Ninth Embodiment)

Next, the ninth embodiment of the present invention will be explained.

Figure 17:
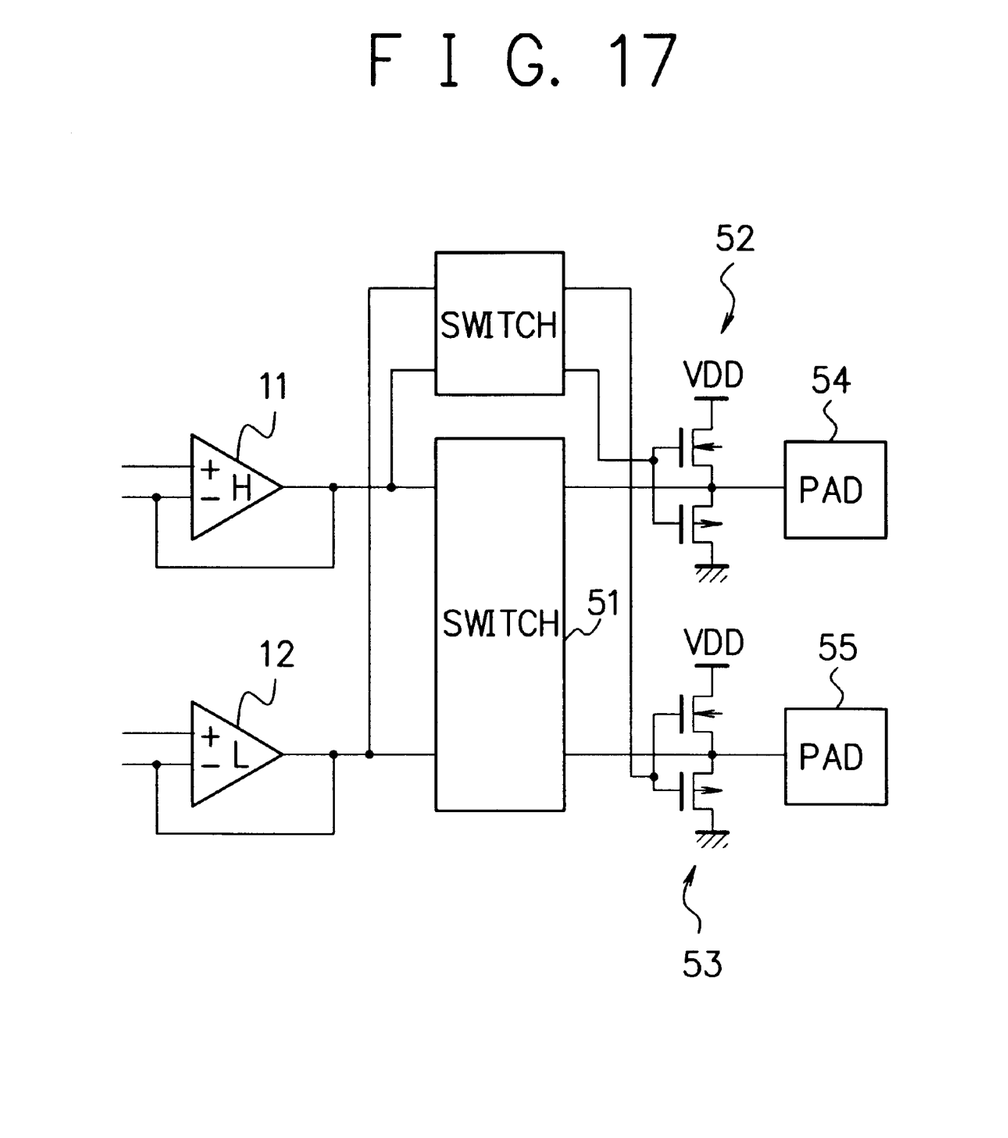
FIG. 17 is a circuit diagram showing an example of part of the configuration of an LCD source driver.

FIG. 17 is a circuit diagram showing an example of part of the configuration of an LCD source driver. In this figure, components having the same reference numerals as those in FIG. 6 provide the same functions, and detailed description thereof is thus omitted.

As shown in FIG. 17, a switch 51 is connected to both the outputs of the positive operational amplifier (H-side operational amplifier) 11 and the negative operational amplifier (L-side operational amplifier) 12. The switch 51 further has its outputs connected to output PADs 54 and 55 respectively corresponding to the H-side operational amplifier 11 and the L-side operational amplifier 12.

The H-side operational amplifier 11 and the L-side operational amplifier 12 also have their outputs connected to charge circuits 52 and 53 each comprising a p-channel transistor and an n-channel transistor. For example, the charge circuit 52 is composed of an n-channel transistor having its source connected to the power supply VDD and a p-channel transistor having its source connected to the ground GND. The drains of the n- and p-channel transistors are connected to each other. The gates of them are connected to the output of the H-side operational amplifier 11. The common drain of them connected to the PAD 54. The charge circuit 53 is similarly configured.

In this configuration, the switch 51 switches between the turn-on and -off operations. If, for example, the switch 51 is open during a video blanking period when the offsets in the operational amplifiers 11 and 12 are being corrected, each transistor of the charge circuits 52 and 53 uses outputs from the operational amplifiers 11 and 12 to precharge the circuit from an output set voltage up to the voltage different from that voltage by the threshold voltage Vth of the transistors. By performing this operation during the video blanking period, the adverse effect of the offset cancel operation can be avoided during the video period.

The above-described embodiments only illustrate implementation of the present invention and should not be construed to limit the technical scope of the present invention. That is, the present invention can be implemented in various forms without deviating from spirits or major features thereof.

What is claimed is:

1. An offset cancel circuit for an operational amplifier, comprising:

a capacitive element for storing a voltage to be amplified by an operational amplifier section and containing an offset, and feedback-controlling a voltage value of said operational amplifier section based on the stored voltage;

a first switching element for short-circuiting one input gate of said operational amplifier section with the other input gate thereof; and a second switching element for switching over operation between the storage operation for the voltage into said capacitive element and the feedback control operation based on the value of the voltage stored in said capacitive element.

2. An offset cancel circuit for an operational amplifier comprising a pair of current mirror sections and a pair of first differential input sections connected to said current mirror sections, said circuit comprising:

a pair of second differential input sections connected to said current mirror sections;

a first switching element connected between the input gate of one of said first differential input sections, and an input terminal;

a second switching element connected between the input gate of one of said first differential input sections, and an output terminal;

a third switching element connected between the input gate of one of said second differential input sections, and said output terminal; and a capacitive element connected to the input gate of one of said second differential input sections.

3. A circuit according to claim 2, wherein said capacitive element having one terminal connected to said input gate of said one of said second differential input sections, has another terminal connected to the ground.

4. A circuit according to claim 2, wherein said capacitive element having one terminal connected to said input gate of said one of said second differential input sections, has another terminal connected to a power supply.

5. A circuit according to claim 2, wherein two capacitive elements are connected to said input gate of said one of said second differential input sections such that one of said capacitive elements having one terminal connected to said input gate of said one of said second differential input sections has another terminal connected to the ground, and the other of said capacitive elements having one terminal connected to said input gate of said one of said second differential input sections has another terminal connected to a power supply.

6. A circuit according to claim 2, wherein a transistor having its drain and gate connected to the same node is connected to the source side of each transistor constituting said second differential input sections.

7. A circuit according to claim 2, further comprising fourth and fifth switching elements between the drain side of said first differential input sections and the drain side of said second differential input sections.

8. A circuit according to claim 2, wherein the other of said second differential input sections has its input gate connecting to a sixth switching element and a second capacitive element, and said sixth switching element has another terminal connected to said input terminal.

9. A circuit according to claim 2, wherein a seventh switching element as dummy is connected between said input gate of said one of said second differential input sections and said capacitive element.

10. A circuit according to claim 1, wherein said first and/or second switching element comprises a transfer gate formed by a combination of a p-channel MOS transistor and an n-channel MOS transistor.

11. A circuit according to claim 1, wherein said first and/or second switching element comprises a transfer gate comprising a p-channel MOS transistor or an n-channel MOS transistor.

12. A circuit according to claim 1, further comprising a waveform shaping circuit for shaping the waveform of a control signal for controlling ON/OFF-changeover operation of said first and/or second switching element.

13. A circuit according to claim 12, wherein said waveform shaping circuit comprises a plurality of inverters connected in multistage.

14. A circuit according to claim 13, wherein said waveform shaping circuit comprises a through-current preventing circuit for preventing a through current from flowing.

15. A circuit according to claim 14, wherein said through-current preventing circuit comprises a plurality of inverters connected in multistage and each having its p- or n-channel side alternately vertically stacked, and transistors which are closer to the power supply or the ground have their gates connected in common for control.

16. A circuit according to claim 14, wherein said through-current preventing circuit has such a connection relationship repeated for a plurality of stages that the common drain output of the p- and n-channel sides of said inverter is connected to the p-channel gate of the next inverter, the common drain output of the p- and n-channel sides thereof is connected to the n-channel gate of the next inverter, and the gate to which the common drain output from the preceding inverter is not connected, is separately and commonly connected to the n- and p-channel sides for control.

17. A circuit according to claim 2, wherein said operational amplifier section comprises a second current mirror section and a third differential input section reverse in types of p and n to said current mirror section and said first differential input section, and said third differential input section has two input gates connected to the connection nodes between said current mirror section and said first differential input section.

18. A circuit according to claim 17, wherein said operational amplifier section comprises two pairs of current mirror sections respectively connected to the connection nodes between said current mirror section and said first differential input section, and a fourth differential input section connected to said two pairs of current mirror sections.

19. An operational amplifier comprising an operational amplifier section and an offset cancel circuit for canceling an offset in said operational amplifier section, said offset cancel circuit comprising:
  a capacitive element for storing a voltage to be amplified by said operational amplifier section and containing an offset, and feedback-controlling a voltage value of said operational amplifier section based on the stored voltage;
  a first switching element for short-circuiting one input gate of said operational amplifier section with the other input gate thereof; and
  a second switching element for switching over operation between the storage operation for the voltage into said capacitive element and the feedback control operation based on the value of the voltage stored in said capacitive element.

20. An operational amplifier comprising an operational amplifier section and an offset cancel circuit for canceling an offset in said operational amplifier section, said offset cancel circuit comprising:
  a capacitive element for storing a voltage to be amplified by said operational amplifier section and containing an offset, and feedback-controlling a voltage value of said operational amplifier section based on the stored voltage;
  a first switching element for short-circuiting one input gate of said operational amplifier section with the other input gate thereof; and
  a second switching element for switching over operation between the storage operation for the voltage into said capacitive element and the feedback control operation based on the value of the voltage stored in said capacitive element, and
  said operational amplifier section comprises a pair of current mirror sections and a pair of first differential input sections connected to said current mirror sections, and said offset cancel circuit comprises:
  a pair of second differential input sections connected to said current mirror sections;
  a first switching element connected between the input gate of one of said first differential input sections, and an input terminal;
  a second switching element connected between the input gate of one of said first differential input sections, and an output terminal;
  a third switching element connected between the input gate of one of said second differential input sections, and said output terminal; and a capacitive element connected to the input gate of one of said second differential input sections.

21. An amplifier according to claim 20, wherein said operational amplifier section comprises a second current mirror section and a third differential input section reverse in types of p and n to said current mirror section and said first differential input section, and said third differential input section has two input gates connected to the connection nodes between said current mirror section and said first differential input section.

22. An amplifier according to claim 21, wherein said operational amplifier section comprises two pairs of current mirror sections connected to the connection nodes between said current mirror section and said first differential input section, and a fourth differential input section connected to said two pairs of current mirror sections.

23. An amplifier according to claim 19, wherein said operational amplifier section and said offset cancel circuit are provided in an LCD source driver IC.

24. A circuit according to claim 1, further comprising a circuit for precharging an output of said operational amplifier with an output of said operational amplifier section while an offset in said operational amplifier section is being corrected.

* * * * *